(12) United States Patent
Mallick et al.

(10) Patent No.: US 10,379,139 B2
(45) Date of Patent: Aug. 13, 2019

(54) METHODS, SYSTEMS AND DEVICES FOR TESTING CIRCUIT MODULES USING A MICROBACKPLANE INTERFACE

(71) Applicant: Western Digital Technologies, Inc., Irvine, CA (US)

(72) Inventors: Sohail Mallick, Fremont, CA (US); Dmitry Vaysman, San Jose, CA (US); Hyun Soo Kim, Yongin-si (KR); Brian Hokyee Tse, Newark, CA (US); Hariharan Venkataramani, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 40 days.

(21) Appl. No.: 15/621,567

(22) Filed: Jun. 13, 2017

(65) Prior Publication Data

US 2018/0299485 A1 Oct. 18, 2018

Related U.S. Application Data

(60) Provisional application No. 62/486,446, filed on Apr. 17, 2017.

(51) Int. Cl.
*G01R 1/06* (2006.01)
*G01R 31/04* (2006.01)
*G01R 31/01* (2006.01)
*G01R 31/28* (2006.01)

(52) U.S. Cl.
CPC ............... *G01R 1/06* (2013.01); *G01R 31/01* (2013.01); *G01R 31/04* (2013.01); *G01R 31/2808* (2013.01)

(58) Field of Classification Search
CPC .............................. G01R 31/01; G01R 31/04
See application file for complete search history.

(56) References Cited

U.S. PATENT DOCUMENTS

| | | | | |
|---|---|---|---|---|
| 5,600,788 A | * | 2/1997 | Lofgren | G01R 31/318536 714/31 |
| 5,659,680 A | * | 8/1997 | Cunningham | G01R 31/31907 714/25 |
| 6,115,242 A | * | 9/2000 | Lambrecht | G06F 1/20 257/686 |
| 2009/0322362 A1 | * | 12/2009 | Lim | G01R 31/2884 324/762.06 |
| 2011/0165784 A1 | * | 7/2011 | Gulla | H01R 12/91 439/65 |

(Continued)

*Primary Examiner* — Tung X Nguyen
*Assistant Examiner* — Dominic E Hawkins
(74) *Attorney, Agent, or Firm* — Loza & Loza, LLP; Gabriel Fitch

(57) ABSTRACT

Systems and methods are disclosed for testing circuit modules. A system for testing a circuit module includes a test circuit board configured to interface with a host system, a standard connector implemented on the test circuit board and configured to be attachably coupled to the circuit module, a micro-backplane module configured to be attachably coupled to the circuit module and a micro-backplane module interface connector implemented on the test circuit board and configured to be attachably coupled to the micro-backplane module.

25 Claims, 6 Drawing Sheets

(56) References Cited

U.S. PATENT DOCUMENTS

| | | | |
|---|---|---|---|
| 2015/0241480 A1* | 8/2015 | Harding | G01R 22/065 |
| | | | 324/156 |
| 2015/0277935 A1* | 10/2015 | Desimone | G06F 9/4411 |
| | | | 710/313 |
| 2016/0056554 A1* | 2/2016 | Costello | H01R 12/7076 |
| | | | 439/65 |
| 2016/0365155 A1* | 12/2016 | Kim | G06F 13/4081 |
| 2018/0287713 A1* | 10/2018 | Leigh | H04Q 11/0071 |

* cited by examiner

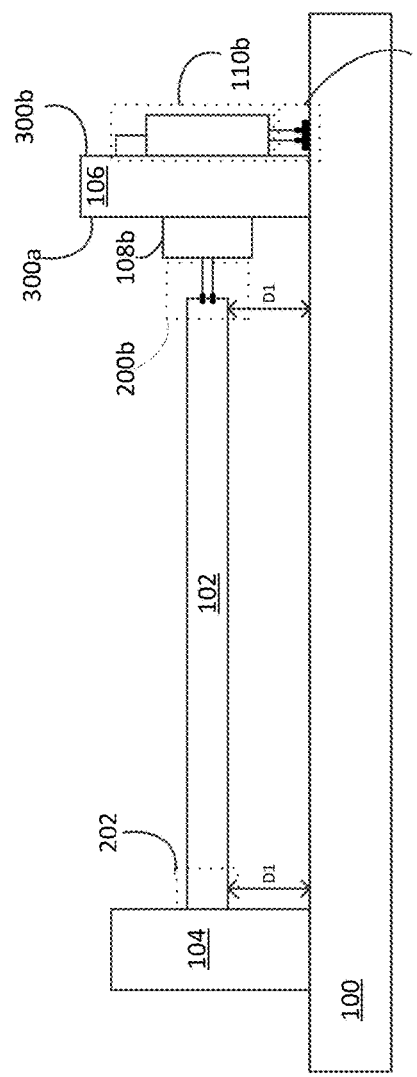
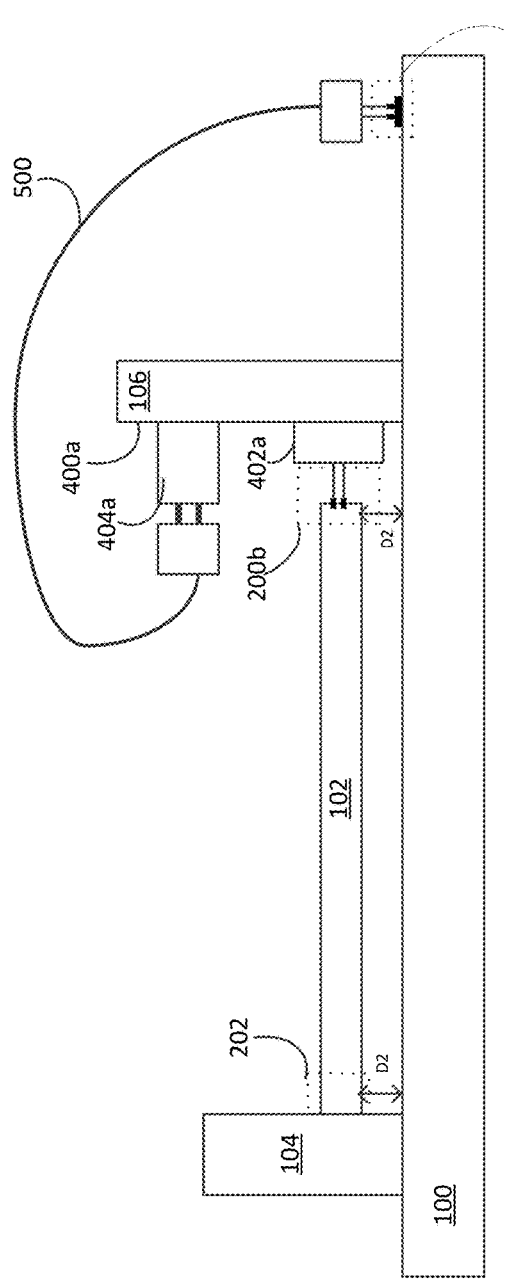
Figure 5A
Figure 5B

METHODS, SYSTEMS AND DEVICES FOR TESTING CIRCUIT MODULES USING A MICROBACKPLANE INTERFACE

RELATED APPLICATION

This application claims priority to U.S. Provisional Application No. 62/486,446 filed Apr. 17, 2017, entitled METHODS, SYSTEMS AND DEVICES FOR TESTING CIRCUIT MODULES USING A MICROBACKPLANE INTERFACE, the disclosure of which is hereby expressly incorporated by reference herein in its entirety.

BACKGROUND

Field

The present disclosure generally relates to circuit board connectors. More specifically, the present disclosure relates to circuit interfacing devices for test assemblies.

Description of Related Art

Testing apparatuses for circuit boards may include screws, connection cables, or buses to interface a device-under-test or unit-under-test, to a test circuit board. Existing techniques of connecting a device to a test circuit board may introduce noise to test signals, damage to the device, and/or limitations on the testing capability of the device.

SUMMARY

In accordance with some implementations, the present disclosure relates to a system for testing a circuit module. The system comprises a test circuit board configured to interface with a host system, a standard connector implemented on the test circuit board and configured to be attachably coupled to the circuit module, a micro-backplane module configured to be attachably coupled to the circuit module and a micro-backplane module interface connector implemented on the test circuit board and configured to be attachably coupled to the micro-backplane module.

In some embodiments, the micro-backplane module includes a first set of connectors configured to be attachably coupled to the circuit module. In some embodiments, the micro-backplane module includes a second set of connectors configured to be attachably coupled to the micro-backplane module interface connector. In some embodiments, a respective connector of the second set of connectors is connected to a respective connector of the first set of connectors.

In some embodiments, each of the micro-backplane module and the standard connector is configured to attachably couple to the circuit module at a first distance perpendicular to a first side of the test circuit board, such that the circuit module is substantially parallel to the test circuit board when attachably coupled to each of the micro-backplane module and the standard connector. In some embodiments, the standard connector is a PCIE M.2 connector. In some embodiments, the test circuit board is a printed circuit board (PCB). In some embodiments, the circuit module is a memory module (e.g., an SSD or solid-state drive module).

In accordance with some implementations, the present disclosure relates to a micro-backplane module with a first set of connectors configured to be attachably coupled to a circuit module and a second set of connectors configured to be attachably coupled to a micro-backplane module interface connector, wherein a respective connector of the second set of connectors is connected to a respective connector of the first set of connectors.

In some embodiments, the first set of connectors is implemented on a first side of the micro-backplane module, and the second set of connectors is implemented on a second side of the micro-backplane module. In some embodiments, the first set of connectors includes one or more female connectors and the second set of connectors includes one or more female connectors. In some embodiments, the second set of connectors includes one or more right-angle connectors. In some embodiments, the second set of connectors is configured to attach to a set of pins affixed to the test circuit board.

In some embodiments, the first set of connectors is implemented on a first side of the micro-backplane module, and the second set of connectors is implemented on the first side of the micro-backplane module. In some embodiments, the first set of connectors includes one or more female connectors and the second set of connectors includes one or more male connectors.

In some embodiments, the second set of connectors is configured to attachably couple with one or more connection cables, and the second set of connectors is further configured to be attachably coupled to the micro-backplane module interface connector via the one or more connection cables.

In accordance with some implementations, the present disclosure relates to a method of providing a test apparatus for a circuit module, comprising providing a test circuit board configured to interface with a host system and implementing a standard connector on the test circuit board. In some implementations, the method includes implementing a micro-backplane module interface connector on the test circuit board and electrically coupling a micro-backplane module to the micro-backplane module interface connector. In some implementations, the method includes electrically coupling the micro-backplane module to the circuit module and electrically coupling the circuit module to the standard connector.

In some implementations, electrically coupling the micro-backplane module to the micro-backplane module interface connector further includes electrically coupling the micro-backplane module to one or more connector cables and electrically coupling the one or more connector cables to the micro-backplane module interface connector.

In some implementations, the method further includes providing a first set of electrical connection points on a first end of the circuit module, and providing a second set of electrical connection points on a second end of the circuit module, the second set of electrical connection points configured to be attachably coupled to the standard connector. The method may further include providing a first set of connectors on the micro-backplane module, the first set of connectors configured to be attachably coupled to the first set of electrical connection points and providing a second set of connectors on the micro-backplane module, the second set of connectors configured to be attachably coupled to a micro-backplane module interface connector.

In some implementations, the method further includes assigning a respective electrical signal to a respective electrical connection point of the first set of electrical connection points on the circuit module, assigning the respective electrical connection point to a respective connector of the first set of connectors on the micro-backplane module and assigning the respective connector of the first set of connectors to a respective connector of the second set of connectors on the micro-backplane module.

In accordance with some implementations, the present disclosure relates to an apparatus for testing a circuit module, comprising a test circuit board comprising a standard connector and a micro-backplane module interface connector, means for electrically coupling a micro-backplane module to the micro-backplane module interface connector, means for electrically coupling the micro-backplane module to a circuit module, and means for electrically coupling the circuit module to the standard connector.

In some embodiments, the apparatus further comprises means for electrically coupling a first set of electrical connection points on a first end of the circuit module to a first set of connectors on the micro-backplane module, means for electrically coupling a second set of electrical connection points on a second end of the circuit module to the standard connector, and means for electrically coupling a second set of connectors on the micro-backplane module to the micro-backplane module interface connector.

In some embodiments, the apparatus further comprises means for connecting a respective electrical signal to a respective electrical connection point of the first set of electrical connection points on the circuit module, means for connecting the respective electrical connection point to a respective connector of the first set of connectors on the micro-backplane module, and means for connecting the respective connector of the first set of connectors to a respective connector of the second set of connectors on the micro-backplane module.

In some embodiments, the apparatus further comprises means for implementing the first set of connectors on a first side of the micro-backplane module, and means for implementing the second set of connectors on a second side of the micro-backplane module. In some embodiments, the apparatus further comprises means for electrically coupling the micro-backplane module to one or more connector cables and means for electrically coupling the one or more connector cables to the micro-backplane module interface connector. In some embodiments, the apparatus further comprises means for implementing the first set of connectors on a first side of the micro-backplane module, and means for implementing the second set of connectors on the first side of the micro-backplane module.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

Various embodiments are depicted in the accompanying drawings for illustrative purposes, and should in no way be interpreted as limiting the scope of this disclosure. In addition, various features of different disclosed embodiments can be combined to form additional embodiments, which are part of this disclosure.

FIG. 5A illustrates a profile view of an example test apparatus for a circuit module according to one or more embodiments.

FIG. 5B illustrates an example implementation of a test apparatus for a circuit module using a micro-backplane module according to one or more embodiments.

DETAILED DESCRIPTION

While certain embodiments are described, these embodiments are presented by way of example only and are not intended to limit the scope of protection. Indeed, the novel methods and systems described herein may be embodied in a variety of other forms. Furthermore, various omissions, substitutions, and changes in the form of the methods and systems described herein may be made without departing from the scope of protection.

The headings provided herein are for convenience only and do not necessarily affect the scope or meaning of the claimed invention. Disclosed herein are examples, implementations, configurations, and/or embodiments relating to providing a test apparatus for a circuit module.

Certain embodiments disclosed herein provide the ability to connect a circuit module (e.g., an SSD module) quickly, securely and with high signal integrity, to a test circuit board. In some embodiments, the circuit module is electrically and/or physically coupled to the test circuit board via a micro-backplane module. The micro-backplane module may couple one or more circuit modules directly to the test circuit board, or may couple one or more circuit modules indirectly to the test circuit board through an intermediate connection device, such as a connection cable.

Previous non-backplane implementations had interfaces that were limited in the number of signals/functions provided and they may also have involved an M.2 SSD (front-end) connector for Test Signals. This required additional components on the M.2 SSD device which has strict real estate limitations owing to its small size. In addition, it also required specific rework/soldering to enable such signals during test, validation and RMA (reliability, maintainability and availability) studies.

Test Apparatus

Figure 1:
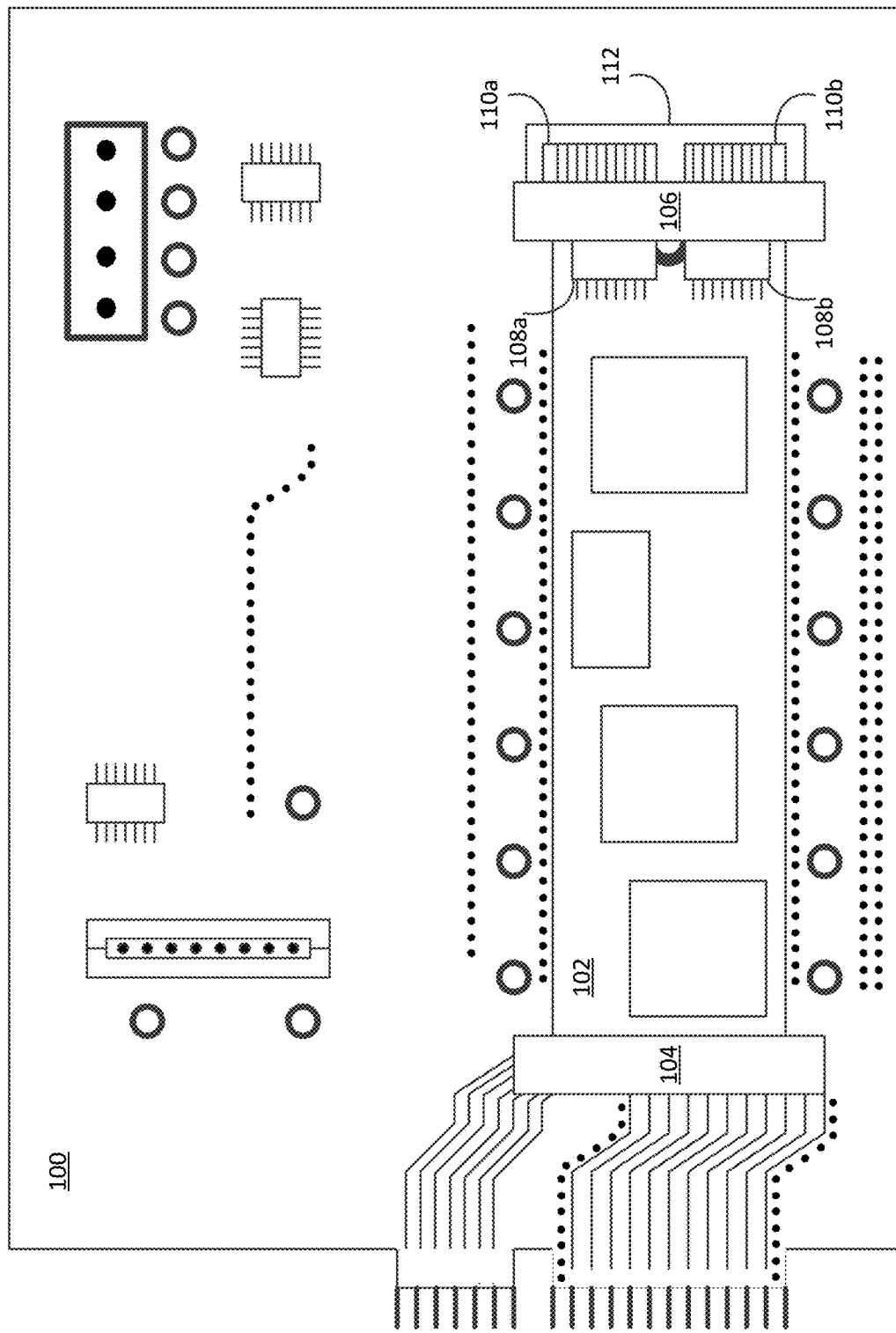
FIG. 1 is a diagram of a top-down view of an example test circuit board implementing an example circuit module according to one or more embodiments.

FIG. 1 is a diagram of a top-down view of an example test circuit board 100 implementing an example circuit module 102, according to some embodiments. The test circuit board 100 may be configured to interface with one or more host systems. In some embodiments, test circuit board 100 may interface with one or more host systems through ports, pins and/or other connection features implemented on test circuit board 100. In some embodiments, circuit module 102 is referred to as a unit under test (UUT). In some embodiments, circuit module 102 is a solid-state memory device (SSD) module, and includes one or more memory sub-modules.

In some embodiments, test circuit board 100 may include processing devices that may be configured to execute instructions and/or perform operations. For example, test circuit board 100 may include a central processing unit (CPU), an application-specific integrated circuit (ASIC), a field-programmable gate array (FPGA), a controller, a processor, etc. Test circuit board 100 may also include various types of memory and/or storage media/medium, such as volatile memory (e.g., random-access memory (RAM)) or non-volatile memory (e.g., magnetic media, solid-state media, etc.).

In some embodiments, circuit module 102 may include processing devices that may be configured to execute instructions and/or perform operations. For example, circuit module 102 may include a central processing unit (CPU), an application-specific integrated circuit (ASIC), a field-programmable gate array (FPGA), a controller, a processor, etc. Circuit module 102 may also include various types of memory and/or storage media/medium, such as volatile memory (e.g., random-access memory (RAM)) or non-volatile memory (e.g., magnetic media, solid-state media, etc.).

While certain description herein may refer to solid state memory generally, one having ordinary skill in the art understands that solid state memory may comprise one or more of various types of solid state non-volatile memory devices such as flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NAND memory (e.g., single-level cell (SLC) memory, multi-level cell (MLC) memory, or any combination thereof), NOR memory, electrically erasable programmable read-only memory (EEPROM), Ferroelectric Memory (FeRAM), Magnetoresistive RAM (MRAM), other discrete NVM (non-volatile memory) chips, or any combination thereof.

As illustrated in FIG. 1, in some embodiments, test circuit board 100 includes a standard connector 104, implemented on test circuit board 100. For example, standard connector 104 may be soldered, inserted, plugged into or otherwise electrically and/or physically connected to test circuit board 100. In some embodiments, standard connector 104 is a PCIE M.2 connector.

In certain embodiments, the standard connector 104 may present an interface consistent with one or more data communication standards. For example, the standard connector 104 may comprise a serial advanced technology attachment ("SATA") connector. Although the embodiment of FIG. 1 illustrates a PCIE M.2 connector, those skilled in the art will understand that principles disclosed herein may be applicable to any suitable or desirable electrical connection interface configured to provide power and/or data signals. For example, the standard connector 104 may be a peripheral component interconnect ("PCI") or PCI express ("PCI-e") connector, universal serial bus ("USB") connector, small computer system interface ("SCSI") connector, Thunderbolt connector, or any other type of connector including at least one power pin.

Additionally, FIG. 1 illustrates implementation of a micro-backplane module 106. In some embodiments, (e.g., while circuit module 102 is undergoing testing), circuit module 102 is electrically and/or physically coupled to micro-backplane module 106. In some embodiments, micro-backplane module 106 includes at least a first set of connectors 108 (e.g., set 108a and set 108b). The first set or sets of connectors 108 may be configured to be attachably coupled (e.g., electrically and/or physically coupled) to circuit module 102.

In some embodiments, micro-backplane module 106 includes at least a second set of connectors 110 (e.g., set 110a and set 110b). The second set or sets of connectors 110 may be configured to be attachably coupled (e.g., electrically and/or physically coupled) to a micro-backplane module interface connector 112. In some embodiments, a respective connector of the second set of connectors is connected to a respective connector of the first set of connectors. In some embodiments, a respective connector of the second set of connectors is connected to a plurality of respective connectors of the first set of connectors. In some embodiments, a respective connector of the second set of connectors and/or a respective connector of the second set of connectors is associated with a respective electrical signal (e.g., a test signal, a test voltage, an I/O signal). In some embodiments, the respective electrical signal is associated with a host computing device (e.g., a testing device).

In some embodiments, test circuit board 100 is a printed circuit board (PCB). In some embodiments, test circuit board 100 is a multi-layered PCB. In some embodiments, circuit module 102 includes a printed circuit board (PCB). In some embodiments, circuit module 102 includes a multi-layered PCB. In some embodiments, micro-backplane module 106 includes a printed circuit board (PCB). In some embodiments, micro-backplane module 106 includes a multi-layered PCB.

In some embodiments, the standard connector 104, the first set of connectors 108, the second set of connectors 110 and/or the micro-backplane module interface connector 112 may include or interface with one or more data lines (e.g., one or more wires, traces, pins, etc.) that allow the circuit module 102 to communicate data with a host computing device, and vice versa. For example, the standard connector 104 may include data lines (not shown in FIG. 1) to enable circuit module 102 to receive data from and/or transmit data to a host computing device involved in a testing procedure of circuit module 102. In another embodiment, a host computing device may provide an input voltage to test circuit board 100 and/or circuit module 102. The host computing device may use the input voltage to operate one or more components of the test circuit board 100 (e.g., a storage medium, a processing device, a motor, etc.), and/or charge one or more components of the test circuit board 100 (e.g., charge a battery of test circuit board 100).

FIG. 1 illustrates an apparatus for testing a circuit module 102, comprising means for implementing a standard connector 104 on a test circuit board 100 (e.g., soldering), means for implementing a micro-backplane module interface connector 112 on the test circuit board 100 (e.g., soldering), and means for electrically coupling a micro-backplane module 106 to the micro-backplane module interface connector 112 (e.g., using one or more connectors). The apparatus further comprises means for electrically coupling the micro-backplane module 106 to the circuit module 102 (e.g., using one or more connectors), and means for electrically coupling the circuit module 102 to the standard connector 104 (e.g., using one or more connectors).

In some embodiments, the test apparatus of the present disclosure provides a seamless interface to the circuit module (e.g., the M.2 SSD Device under Test). In addition this test apparatus supports high speed signaling (e.g., at 200 MHz). Previous implementations of test apparatuses do not support high speed signaling due to a limitation of pins supported on the circuit module (e.g., M.2 SSD device). The current disclosure provides additional signaling as well as higher speed signaling yet it does not require the addition or deletion of components on the circuit module (e.g., M.2 SSD Device). In some embodiments, the test apparatus allows for provision of expanded access to multiple debug interfaces, isolation of debug interfaces from the host-device (front-end) interface (e.g., making it transparent to end-user), enables ease of debug during development and/or facilitates debug during possible field issues in the future without having to laboriously detach the circuit module (e.g., SSD module) from the host or test circuit board.

In some embodiments, the present disclosure relates to a micro-backplane design that permits convenient interfacing to a circuit module (e.g., M.2 SSD Device). In some embodiments, it provides an interface for two connectors (e.g., two 2×8 connectors), each connector having a set of one or more pins, allowing communication of test signals from the circuit module to the test circuit board (e.g., a test assembly). In some embodiments, the test signals that are provided from the circuit module to the test circuit board via the micro-backplane can include (but are not limited to) high speed bus interface(s), JTAG, Serial Port and additional debug signals. In some embodiments, the testing apparatus of the present disclosure provides enhanced mechanical reinforcement of the circuit module or unit-under-test, while it is electrically and physically coupled to the test circuit board via the micro-backplane module. For example, the circuit module "snaps" or "clips" into the standard connector 104 on one end, and "snaps" or "clips" into the micro-backplane module 106 on another end. This mechanical reinforcement is achieved without the use of mechanical fasteners such as screws, which are difficult to implement and remove. Additionally, this mechanical reinforcement protects the circuit module from vibration, movement and physical disconnection, over other testing solutions.

FIG. 1 illustrates an apparatus for testing a circuit module 102 that in some embodiments includes a means for implementing a standard connector 104 on a test circuit board 100, a means for implementing a micro-backplane module interface connector 112 on the test circuit board 100, means for electrically coupling a micro-backplane module 106 to the micro-backplane module interface connector 112, means for electrically coupling the micro-backplane module 106 to the circuit module 102 and means for electrically coupling the circuit module 102 to the standard connector 104.

Additionally, in some embodiments, the apparatus includes a means for providing a test circuit board 100 configured to interface with a host system. The apparatus may also include a means for electrically coupling the micro-backplane module 106 to one or more connector cables, and a means for electrically coupling the one or more connector cables to the micro-backplane module interface connector 112.

Although the present disclosure may refer to various types of interfaces (e.g., USB, Thunderbolt, Lightning, etc.) and communication protocols (e.g., PCI-e), one having ordinary skill in the art understands that the examples, implementations, and/or embodiments disclosed herein may be applicable to any type of interface and/or communication protocol.

Circuit Module

Figure 2A:
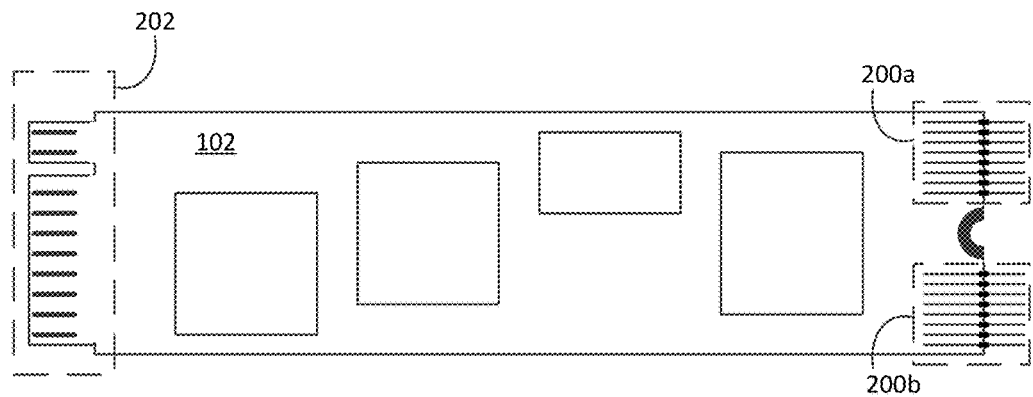
FIG. 2A is a diagram of an example circuit module according to one or more embodiments.

FIG. 2A is a diagram of an example circuit module 102, according to some embodiments. The circuit module 102 may be configured to be attachably coupled (e.g., electrically and/or physically connected) to a test apparatus such as test circuit board 100, as discussed above. The circuit module 102 may also be configured to be attachably coupled (e.g., electrically and/or physically connected) to a micro-backplane module 106, as discussed above. The circuit module 102 of FIG. 2A may represent an embodiment of a circuit module 102 illustrated in FIG. 1. Although a particular embodiment of a circuit module 102 is depicted in FIG. 2A, one having ordinary skill in the art understands that circuit modules as described herein may include one or more features of the circuit module 102 described below, while being embodied in a form other than that illustrated in FIG. 2A. For example, the circuit module may have a different size, shape and/or form than that illustrated in FIG. 2A.

In some embodiments, the circuit module 102 includes at least a first set of electrical connection points 200 (e.g., set 200a and set 200b shown). In some embodiments, the first set of electrical connection points 200 are located on a first end of circuit module 102. In some embodiments, the first set of connectors of a micro-backplane module as described herein (e.g., first set 108 of micro-backplane 106 of FIG. 1), are configured to be attachably coupled to the first set of electrical connection points. Conversely, in some embodiments, the first set of electrical connection points, are configured to be attachably coupled to the first set of connectors of a micro-backplane module. For example, as shown in FIG. 2A, sets 200a and 200b are male connectors, configured to be attachably coupled to two corresponding sets of female connectors on a micro-backplane module.

Figure 2B:
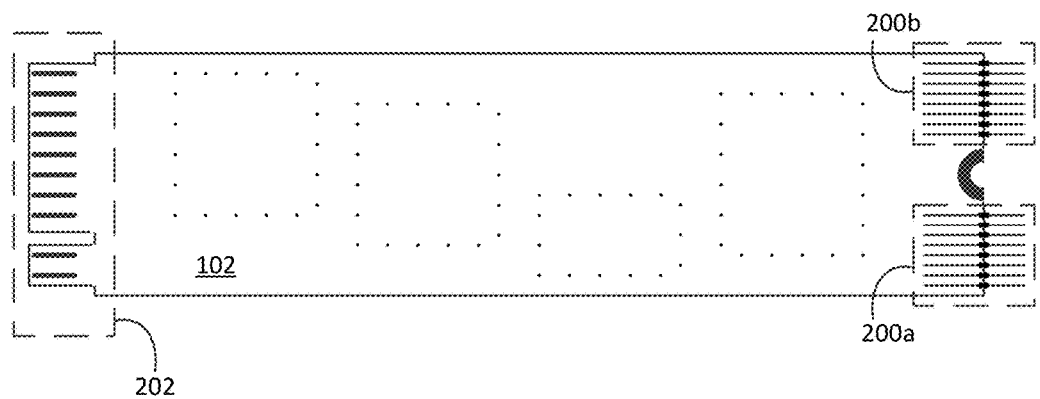
FIG. 2B illustrates a bottom-up view of an example circuit module according to one or more embodiments.

In some embodiments, the circuit module 102 includes at least a second set of electrical connection points 202. In some embodiments, the second set of electrical connection points 202 are located on a second end of circuit module 102 (e.g., the opposite end of circuit module 102 from the first set of electrical connection points 200). In some embodiments, the second set of electrical connection points 202 is configured to be attachably coupled to a standard connector (e.g., standard connector 104 of FIG. 1). For example, the second set of electrical connection points 202 comprises male pins, configured to couple with a set of female ports of standard connector 104 of FIG. 1. FIG. 2A illustrates a top-down view of circuit module 102. FIG. 2B illustrates a bottom-up view of circuit module 102, as described throughout the present disclosure.

Micro-Backplane Modules

FIGS. 3A-3E are diagrams of various views of an example micro-backplane module 106, according to some embodiments. The micro-backplane module 106 may be configured to be attachably coupled to (e.g., electrically and/or physically connected) a circuit module 102, as discussed above. The micro-backplane module 106 may also be configured to be attachably coupled to (e.g., electrically and/or physically connected) a micro-backplane module interface connector 112, as discussed above. The micro-backplane module 106 of FIGS. 3A-3E may represent an embodiment of a micro-backplane module 106 illustrated in FIG. 1. Although a particular embodiment of a micro-backplane module 106 is depicted in FIGS. 3A-3E, one having ordinary skill in the art understands that micro-backplane modules as described herein may include one or more features of the micro-backplane module 106 described below, while being embodied in a form other than that illustrated in FIGS. 3A-3E. For example, the micro-backplane module may have a different size, shape and/or form than that illustrated in FIGS. 3A-3E.

Figure 3A:
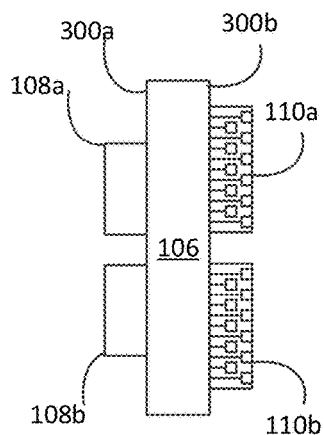
FIG. 3A illustrates a top-down view of an example micro-backplane module according to one or more embodiments.

FIG. 3A illustrates a top-down view of an example micro-backplane module 106. In the example of FIG. 3A, micro-backplane module 106 is shown to have a first side 300a and a second side 300b. One or more first sets of connectors 108 (e.g., set 108a and set 108b) are shown to be implemented on the first side 300a. One or more second sets of connectors 110 (e.g., set 110a and set 110b) are shown to be implemented on the second side 300b.

As described above, first set of connectors 108 may be configured to be attachably coupled to a circuit module (e.g., circuit module 102), and/or attachably coupled to pins, ports or other connection points thereof. In some implementations, one or more of the first set of connectors 108 are female connectors. In some implementations, one or more of the first set of connectors 108 are male connectors. As described above, second set of connectors 110 may be configured to be attachably coupled to a micro-backplane module interface connector (e.g., micro-backplane module interface connector 112), and/or attachably coupled to pins, ports or other connection points thereof. In some implementations, one or more of the second set of connectors 110 are female connectors. In some implementations, one or more of the second set of connectors 110 are male connectors. In some implementations, one or more of the second set of connectors 110 are right-angle connectors.

Figure 3B:
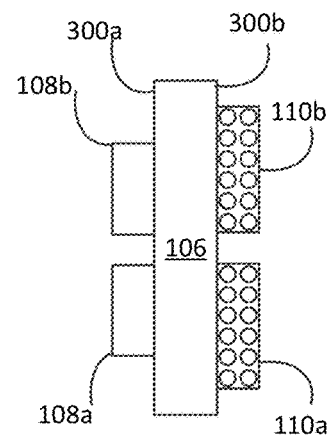
FIG. 3B illustrates a bottom-up view of an example micro-backplane module according to one or more embodiments.

FIG. 3B illustrates a bottom-up view of micro-backplane module 106. In FIG. 3B, the example micro-backplane module 106 includes two sets of female connectors for second set of connectors 110a and 110b.

Figure 3C:
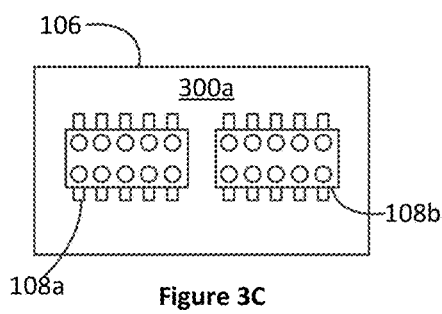
FIG. 3C illustrates a view of a first side of an example micro-backplane module according to one or more embodiments.

FIG. 3C illustrates a view of first side 300a of micro-backplane module 106. In FIG. 3C, the example micro-backplane module 106 includes two sets of female connectors for first set of connectors 108a and 108b.

Figure 3D:
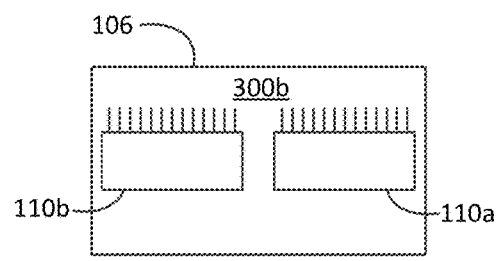
FIG. 3D illustrates a view of a second side of an example micro-backplane module according to one or more embodiments.

FIG. 3D illustrates a view of second side 300b of micro-backplane module 106. In FIG. 3D, the example micro-backplane module 106 includes two sets of right-angle connectors for second set of connectors 110a and 110b. In some embodiments, a particular connector on the second side 300b (e.g., connector 110a) corresponds to a particular connector on the first side 300a (e.g., connector 108a). These connectors may have respective pins, ports or sockets electrically connected to respective pins, ports or sockets of the corresponding connector. In some embodiments, a respective connector on first side 300a has a different number of pins, ports or sockets from a corresponding respective connector on second side 300b. In some embodiments, a respective connector on first side 300a has the same number of pins, ports or sockets as a corresponding respective connector on second side 300b.

Figure 3E:
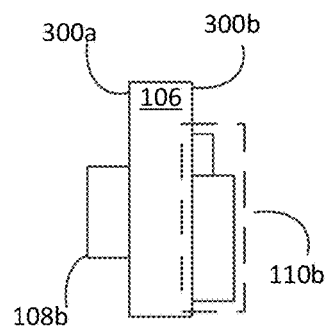
FIG. 3E illustrates a profile view of an example micro-backplane module according to one or more embodiments.

FIG. 3E illustrates a profile view of micro-backplane module 106. In FIG. 3E, the example micro-backplane module 106 is shown to implement one or more first sets of connectors 108 (e.g., set 108b) on a first side 300a of micro-backplane module 106. Additionally, the example micro-backplane module 106 is shown to implement one or more second sets of connectors 110 (e.g., set 110b) on a second side 300b of micro-backplane module 106.

FIGS. 4A-4E are diagrams of various views of an example micro-backplane module 106, according to some embodiments. The micro-backplane module 106 may be configured to be attachably coupled to (e.g., electrically and/or physically connected) a circuit module 102, as discussed above. The micro-backplane module 106 may also be configured to be attachably coupled (e.g., electrically and/or physically connected) to a micro-backplane module interface connector 112, as discussed above. The micro-backplane module 106 of FIGS. 4A-4E may represent an embodiment of a micro-backplane module 106 not illustrated in FIG. 1. Although a particular embodiment of a micro-backplane module 106 is depicted in FIGS. 4A-4E, one having ordinary skill in the art understands that micro-backplane modules as described herein may include one or more features of the micro-backplane module 106 described below, while being embodied in a form other than that illustrated in FIGS. 4A-4E. For example, the micro-backplane module may have a different size, shape and/or form than that illustrated in FIGS. 4A-4E.

Figure 4A:
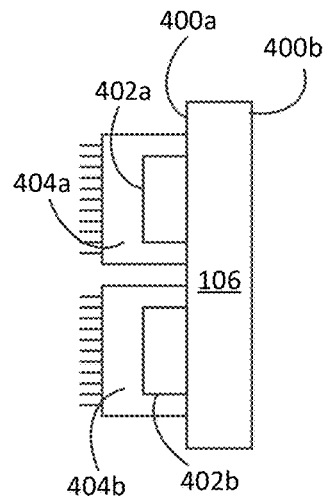
FIG. 4A illustrates a top-down view of an example micro-backplane module according to one or more embodiments.

FIG. 4A illustrates a top-down view of an example micro-backplane module 106. In the example of FIG. 4A, micro-backplane module 106 is shown to have a first side 400a and a second side 400b. One or more first sets of connectors 402 (e.g., set 402a and set 402b) are shown to be implemented on the first side 400a. One or more second sets of connectors 404 (e.g., set 404a and set 404b) are shown to be implemented on the second side 400b.

As described above, first set of connectors 402 may be configured to be attachably coupled to a circuit module (e.g., circuit module 102), and/or attachably coupled to pins, ports or other connection points thereof. In some implementations, one or more of the first set of connectors 402 are female connectors. In some implementations, one or more of the first set of connectors 402 are male connectors. As described above, second set of connectors 404 may be configured to be attachably coupled to a micro-backplane module interface connector (e.g., micro-backplane module interface connector 112), and/or attachably coupled to pins, ports or other connection points thereof. In some implementations, one or more of the second set of connectors 404 are female connectors. In some implementations, one or more of the second set of connectors 404 are male connectors (as shown in FIG. 4A). In some implementations, one or more of the second set of connectors 404 are configured to be attachably coupled to/with one or more intermediate structures (e.g., connection cables), and one or more of the second set of connectors are further configured to be attachably coupled to a micro-backplane module interface connector via the one or more intermediate structures (e.g., connection cables).

Figure 4C:
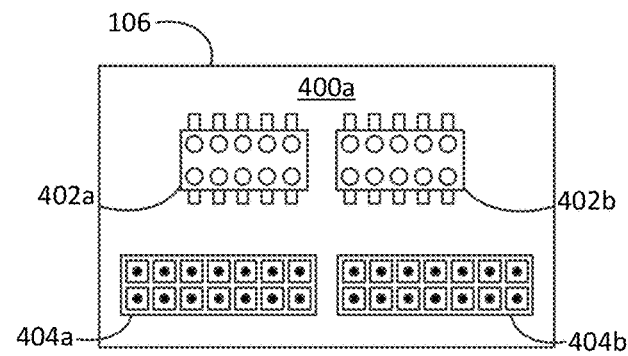
FIG. 4C illustrates a view of a first side of an example micro-backplane module according to one or more embodiments.
Figure 4B:
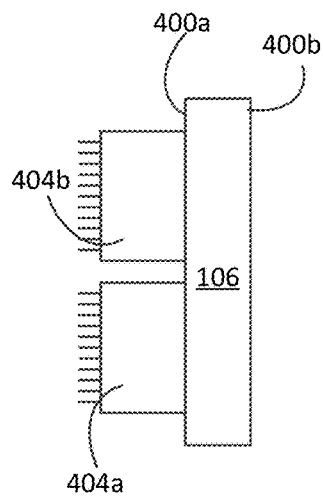
FIG. 4B illustrates a bottom-up view of an example micro-backplane module according to one or more embodiments.

FIG. 4B illustrates a bottom-up view of micro-backplane module 106. In FIG. 4B, the example micro-backplane module 106 includes two sets of male connectors for second set of connectors 404a and 404b. First sets of connectors 402a and 402b are not visible in this example view of an example micro-backplane module 106, because the first sets of connectors 402 and the second sets of connectors 404 are aligned and vertically implemented on the same side (e.g., first side 400a) of micro-backplane module 106.

FIG. 4C illustrates a view of first side 400a of micro-backplane module 106. In FIG. 4C, the example micro-backplane module 106 includes two sets of female connectors for first set of connectors 402a and 402b. Additionally, this view shows the example micro-backplane module 106 includes two sets of male connectors for second set of connectors 404a and 404b.

Figure 4D:
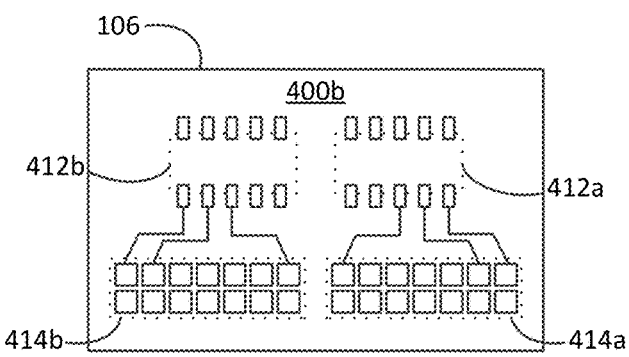
FIG. 4D illustrates a view of a second side of an example micro-backplane module according to one or more embodiments.

FIG. 4D illustrates a view of second side 400b of micro-backplane module 106. In FIG. 4D, the example micro-backplane module 106 illustrates example routing of signals between the footprints 412a and 412b of first sets of connectors 402a and 402b respectively, and the footprints 414a and 414b of second sets of connectors 404a and 404b respectively.

Figure 4E:
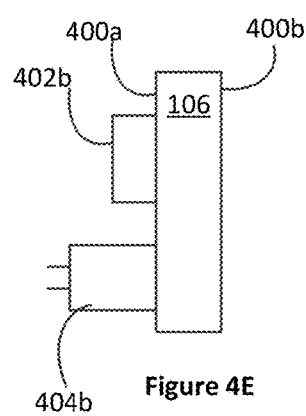
FIG. 4E illustrates a profile view of an example micro-backplane module according to one or more embodiments.

FIG. 4E illustrates a profile view of micro-backplane module 106. In FIG. 4E, the example micro-backplane module 106 is shown to implement one or more first sets of connectors 402 (e.g., set 402b) on a first side 400a of micro-backplane module 106. Additionally, the example micro-backplane module 106 is shown to implement one or more second sets of connectors 404 (e.g., set 404b) on the first side 400a of micro-backplane module 106.

Testing Implementations

FIG. 5A illustrates a profile view of a test apparatus for a circuit module 102. In some embodiments, the test apparatus of FIG. 5A corresponds to the test apparatus illustrated in FIG. 1. FIG. 5A shows an implementation of a standard connector 104 on test circuit board 100. In this example, circuit module 102 is attachably coupled to standard connector 104 using one or more second sets of electrical connection points 202. Additionally, circuit module 102 is shown to be attachably coupled to a micro-backplane module 106 using one or more first sets of electrical connection points 200 (e.g., set 200b, as shown). In this example test apparatus, micro-backplane module 106 includes one or more first sets of connectors 108 (e.g., set 108b of female connectors, as shown), configured to be attachably coupled to one or more first sets of electrical connection points 200 (e.g., set 200b of male connectors).

The test apparatus of FIG. 5A is shown to implement one or more first sets of connectors 108 on a first side 300a of micro-backplane module 106 (e.g., as shown and described with respect to FIGS. 3A-3E above). Additionally, the example of FIG. 5A illustrates implementation of one or more second sets of connectors 110 on a second side 300b of micro-backplane module 106 (e.g., as shown and described with respect to FIGS. 3A-3E above). In this example, micro-backplane module interface connector 112 includes a set of pins affixed to the test circuit board 100. In some embodiments, a second set of connectors 110 (e.g., set 110b) is configured to attach to such a set of pins affixed to the test circuit board. For example, set 110b is shown to include a set of female connectors to couple with the pins of micro-backplane module interface connector 112.

In some embodiments, the micro-backplane module 106 is configured to provide for the circuit module 102 to be held in place at a fixed distance (e.g., height) perpendicular from a surface of the test circuit board 100. For example, as shown in FIG. 5A, circuit module 102 is attachably coupled to standard connector 104 at a height or distance of D1 from test circuit board 100, at a second end of circuit module 102. In some embodiments, the height or distance D1 is an industry standard, and standard connector 104 is configured to attachbly couple with circuit module 102 at this height or distance D1. The example shown in FIG. 5A illustrates that micro-backplane 106 is configured to attachably couple to circuit module 102, via one or more first sets of connectors 108, at the height or distance D1 at a first end of circuit module 102. Effectively, this configuration of the micro-backplane module 106 and/or standard connector 104 results in circuit module 102 being substantially parallel to the test circuit board 100 when attachably coupled to each of the micro-backplane module 106 and the standard connector 104.

FIG. 5B illustrates an example implementation of a test apparatus for circuit module 102, using a micro-backplane module 106, as described above with respect to FIG. 4A-4E. In this example, micro-backplane module 106 is shown with a rotated orientation from the one shown in FIG. 4E. Nonetheless, it can be seen that in this example, one or more first sets of connectors 402 (e.g., 402a) and one or more second sets of connectors 404 (e.g., 404a) are implemented on a first side 400a of micro-backplane module 106. In some embodiments, this arrangement of connectors allows for implementation of an intermediate connection device, such as connection cable 500, between micro-backplane module 106 and micro-backplane module interface connector 112. In the example of FIG. 5B, connection cable 500 comprises a set of flexible wires and two female connectors for interfacing with the male connectors of second set of connectors 404a and the pins of micro-backplane module interface connector 112. FIG. 5B also illustrates that the arrangement of implementing an intermediate connection device such as connection cable 500, may allow for placement of micro-backplane module interface connector 112 at a relatively distant location from micro-backplane module 106 (e.g., a location that is not proximate to module 106).

As described with respect to FIG. 5A, the micro-backplane module 106 of FIG. 5B may also be configured to provide for the circuit module 102 to be held in place at a fixed distance (e.g., height) perpendicular from a surface of the test circuit board 100. For example, as shown in FIG. 5B, circuit module 102 is attachably coupled to standard connector 104 at a height or distance of D2 from test circuit board 100, at a second end of circuit module 102. The example shown in FIG. 5A illustrates that micro-backplane 106 is configured to attachably couple to circuit module 102, via one or more first sets of connectors 402 (e.g., 402a), at the height or distance D2 at a first end of circuit module 102. Effectively, this configuration of the micro-backplane module 106 and/or standard connector 104 results in circuit module 102 being substantially parallel to the test circuit board 100 when attachably coupled to each of the micro-backplane module 106 and the standard connector 104.

Methods of Implementation

Figure 6:
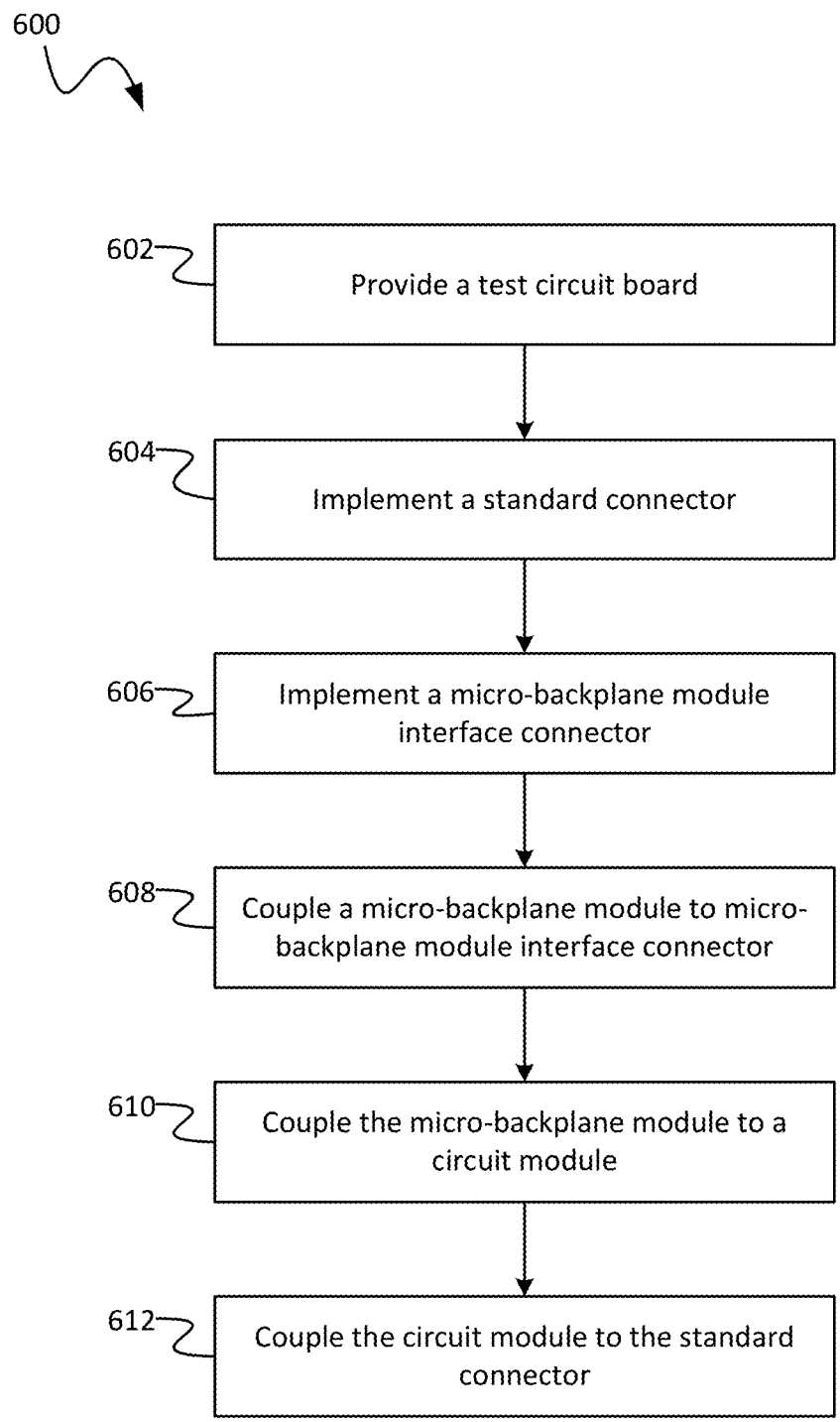
FIG. 6 is a flow diagram illustrating a process for providing a test apparatus for a circuit module according to one or more embodiments.

FIG. 6 is a flow diagram illustrating a method 600 for providing a test apparatus for a circuit module, according to some embodiments. The method starts at block 602 with providing a test circuit board configured to interface with a host system. For example, the test circuit board 100 as described above, with respect to FIGS. 1, 5A and 5B, is configured to interface with a host computing system. In some implementations, the test circuit board is a PCB with one or more components implemented on the test circuit board, such as memory, CPU's, ports, connectors, passive components and active components.

Method 600 includes implementing a standard connector on the test circuit board, represented by block 604. For example, as described above, standard connector 104 is implemented (e.g., soldered onto) test circuit board 100. The method 600 further progresses to block 606 and includes implementing a micro-backplane module interface connector on the test circuit board. For example, as described above, micro-backplane module interface connector 112 is implemented (e.g., soldered onto) test circuit board 100.

At block 608, the method 600 includes electrically coupling a micro-backplane module to the micro-backplane module interface connector. For example, micro-backplane module 106, as described above, plugs onto the pins of micro-backplane module interface connector 112. At block 610, the method includes electrically coupling the micro-backplane module to the circuit module. For example, as described above, the female connectors of a first set of connectors of micro-backplane module 106 connect with the male pins of circuit module 102.

Block 612 illustrates that method 600 includes electrically coupling the circuit module to the standard connector. For example, FIGS. 1, 5A and 5B illustrate configurations of a test apparatus where circuit module 102 is coupled at one end to the standard connector 104.

In some embodiments, electrically coupling the micro-backplane module to the micro-backplane module interface connector further includes electrically coupling the micro-backplane module to one or more connector cables and electrically coupling the one or more connector cables to the micro-backplane module interface connector.

In some embodiments, method 600 includes providing a first set of electrical connection points on a first end of the circuit module. The method 600 may further include providing a second set of electrical connection points on a second end of the circuit module, the second set of electrical connection points configured to be attachably coupled to the standard connector. The method 600 may further include providing a first set of connectors on the micro-backplane module, the first set of connectors configured to be attachably coupled to the first set of electrical connection points and may include providing a second set of connectors on the micro-backplane module, the second set of connectors configured to be attachably coupled to a micro-backplane module interface connector.

Method 600 may include, in some implementations, assigning a respective electrical signal to a respective electrical connection point of the first set of electrical connection points on the circuit module. The method 600 may further include assigning the respective electrical connection point to a respective connector of the first set of connectors on the micro-backplane module, and may include assigning the respective connector of the first set of connectors to a respective connector of the second set of connectors on the micro-backplane module.

Additional Embodiments

Those skilled in the art will appreciate that in some embodiments, other types of systems, devices, and/or apparatuses can be implemented while remaining within the scope of the present disclosure. In addition, the actual steps taken in the processes discussed herein may differ from those described or shown in the figures. Depending on the embodiment, certain of the steps described above may be removed, others may be added.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this disclosure, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this disclosure and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Furthermore, the terms "first," "second," "third," "fourth," etc., as used herein are meant as labels to distinguish among different elements and may not necessarily have an ordinal meaning according to their numerical designation.

All of the processes described above may be embodied in, and fully automated via, software code modules executed by one or more general purpose or special purpose computers or processors. The code modules may be stored on any type of computer-readable medium or other computer storage device or collection of storage devices. Some or all of the methods may alternatively be embodied in specialized computer hardware.

What is claimed is:

1. A system, comprising:
    a test circuit board configured to interface with a host system;
    a standard connector implemented on the test circuit board and configured to be attachably coupled to a circuit module, wherein the circuit module includes a solid state device (SSD);
    a micro-backplane module configured to be attachably coupled to the circuit module; and
    a micro-backplane module interface connector implemented on the test circuit board and configured to be attachably coupled to the micro-backplane module, wherein the micro-backplane module interface connector provides a path for a test signal from the circuit module to the test circuit board.

2. The system of claim 1, wherein the micro-backplane module includes a first set of connectors configured to be attachably coupled to the circuit module.

3. The system of claim 2, wherein the micro-backplane module includes a second set of connectors configured to be attachably coupled to the micro-backplane module interface connector.

4. The system of claim 3, wherein a respective connector of the second set of connectors is connected to a respective connector of the first set of connectors.

5. The system of claim 1, wherein each of the micro-backplane module and the standard connector is configured to attachably couple to the circuit module at a first distance perpendicular to a first side of the test circuit board, such that the circuit module is substantially parallel to the test circuit board when attachably coupled to each of the micro-backplane module and the standard connector.

6. The system of claim 1, wherein the standard connector is a PCIE M.2 connector.

7. The system of claim 1, wherein the micro-backplane module interface connector is configured to provide an interface for a particular debugging operation on the circuit module, wherein the particular debugging operation is an operation that cannot be provided through the standard connector.

8. A micro-backplane module, comprising:
a first set of connectors configured to be attachably coupled to a circuit module, wherein the circuit module is a memory module that includes a solid state memory; and
a second set of connectors configured to be attachably coupled to a micro-backplane module interface connector, wherein a respective connector of the second set of connectors is coupled to a respective connector of the first set of connectors,
wherein the micro-backplane module is configured to enable a high speed signal to travel from the circuit module to the first set of connectors and the second set of connectors.

9. The micro-backplane module of claim 8, wherein the first set of connectors is implemented on a first side of the micro-backplane module, and the second set of connectors is implemented on a second side of the micro-backplane module.

10. The micro-backplane module of claim 9,
wherein the first set of connectors includes first female connectors configured to be coupled to male connectors of the circuit module,
wherein the first female connectors include (i) a first plurality of first female connectors arranged in at least two rows, and (ii) a second plurality of first female connectors arranged in at least two rows,
wherein the second set of connectors includes second female connectors configured to be coupled to pins of a test circuit board, and
wherein the second female connectors include (i) a first plurality of second female connectors arranged in at least two rows, and (ii) a second plurality of second female connectors arranged in at least two rows.

11. The micro-backplane module of claim 9, wherein the second set of connectors includes one or more right-angle connectors.

12. The micro-backplane module of claim 9, wherein the second set of connectors is configured to attach to a set of pins affixed to a test circuit board.

13. The micro-backplane module of claim 8, wherein the first set of connectors is implemented on a first side of the micro-backplane module, and the second set of connectors is implemented on the first side of the micro-backplane module.

14. The micro-backplane module of claim 13,
wherein the first set of connectors includes female connectors configured to be coupled to male connectors of the circuit module,
wherein the female connectors include (i) a first plurality of female connectors arranged in at least two rows, and (ii) a second plurality of female connectors arranged in at least two rows,
wherein the second set of connectors includes one or more male connectors, and
wherein the male connectors of the second set of connectors include (i) a first plurality of male connectors arranged in at least two rows, and (ii) a second plurality of male connectors arranged in at least two rows.

15. The micro-backplane module of claim 14, wherein the second set of connectors is configured to attachably couple with one or more connection cables, and the second set of connectors is further configured to be attachably coupled to the micro-backplane module interface connector via the one or more connection cables.

16. A method, comprising:
providing a test circuit board configured to interface with a host system;
providing a standard connector on the test circuit board;
providing a micro-backplane module interface connector on the test circuit board;
electrically coupling a micro-backplane module to the micro-backplane module interface connector;
electrically coupling the micro-backplane module to a circuit module, wherein the circuit module includes a solid state device (SSD); and
electrically coupling the circuit module to the standard connector.

17. The method of claim 16, wherein electrically coupling the micro-backplane module to the micro-backplane module interface connector further includes:
electrically coupling the micro-backplane module to one or more connector cables; and
electrically coupling the one or more connector cables to the micro-backplane module interface connector.

18. The method of claim 16, further comprising:
providing a first set of electrical connection points on a first end of the circuit module;
providing a second set of electrical connection points on a second end of the circuit module, the second set of electrical connection points configured to be attachably coupled to the standard connector;
providing a first set of connectors on the micro-backplane module, the first set of connectors configured to be attachably coupled to the first set of electrical connection points; and
providing a second set of connectors on the micro-backplane module, the second set of connectors configured to be attachably coupled to the micro-backplane module interface connector.

19. The method of claim 18, further comprising:
assigning a respective electrical signal to a respective electrical connection point of the first set of electrical connection points on the circuit module;
assigning the respective electrical connection point to a respective connector of the first set of connectors on the micro-backplane module; and
assigning the respective connector of the first set of connectors to a respective connector of the second set of connectors on the micro-backplane module.

20. An apparatus for testing a circuit module, comprising:
a test circuit board comprising:
a standard connector that includes at least one power pin; and a micro-backplane module interface connector configured to provide a path for a test signal from a circuit module, wherein the circuit module includes a solid state device (SSD);

means for electrically coupling a micro-backplane module to the micro-backplane module interface connector;

means for electrically coupling the micro-backplane module to the circuit module; and means for electrically coupling the circuit module to the standard connector.

21. The apparatus of claim 20, further comprising:

means for electrically coupling a first set of electrical connection points on a first end of the circuit module to a first set of connectors on the micro-backplane module;

means for electrically coupling a second set of electrical connection points on a second end of the circuit module to the standard connector; and means for electrically coupling a second set of connectors on the micro-backplane module to the micro-backplane module interface connector.

22. The apparatus of claim 21, further comprising:

means for connecting a respective electrical signal to a respective electrical connection point of the first set of electrical connection points on the circuit module;

means for connecting the respective electrical connection point to a respective connector of the first set of connectors on the micro-backplane module; and means for connecting the respective connector of the first set of connectors to a respective connector of the second set of connectors on the micro-backplane module.

23. The apparatus of claim 21, further comprising:

means for providing the first set of connectors on a first side of the micro-backplane module; and means for providing the second set of connectors on a second side of the micro-backplane module.

24. The apparatus of claim 21, further comprising:

means for electrically coupling the micro-backplane module to one or more connector cables; and means for electrically coupling the one or more connector cables to the micro-backplane module interface connector.

25. The apparatus of claim 24, further comprising:

means for providing the first set of connectors on a first side of the micro-backplane module; and means for providing the second set of connectors on the first side of the micro-backplane module.

\* \* \* \* \*